US006278224B1

(12) United States Patent
Sawada et al.
(10) Patent No.: US 6,278,224 B1
(45) Date of Patent: Aug. 21, 2001

(54) ULTRASONIC TRANSDUCER AND METHOD FOR MANUFACTURING THE SAME

(75) Inventors: Yukihiko Sawada, Tokorozawa; Tomoki Funakubo; Katsuhiro Wakabayashi, both of Hachioji; Shinan Wang, Aichi-gun; Masayoshi Esashi, Sendai, all of (JP)

(73) Assignee: Olympus Optical Co., Ltd., Tokyo (JP)

( * ) Notice: Subject to any disclaimer, the term of this patent is extended or adjusted under 35 U.S.C. 154(b) by 0 days.

(21) Appl. No.: 09/363,633

(22) Filed: Jul. 29, 1999

(30) Foreign Application Priority Data

Jul. 31, 1998 (JP) ..................................... 10-217804

(51) Int. Cl.$^7$ ..................................... H01L 41/08

(52) U.S. Cl. ........................ 310/334; 310/368; 310/369; 310/335

(58) Field of Search .............................. 310/322, 326, 310/327, 334, 367, 368, 369, 335

(56) References Cited

U.S. PATENT DOCUMENTS 3,745,385 * 7/1973 Nakajima et al. .................. 310/368
4,281,550 * 8/1981 Erikson .................................. 73/626
5,886,454 * 3/1999 Ito et al. .............................. 310/322
6,049,159 * 4/2000 Barthe et al. ....................... 310/334
6,111,818 * 8/2000 Bowen et al. ....................... 310/334

FOREIGN PATENT DOCUMENTS 60-85699 5/1985 (JP) ............................ H04R/17/00

OTHER PUBLICATIONS

"Handbook of Medical Ultrasonic Equipments", (Nippon Electronic Mechanical Industries Association; Corona Publishing Co., Ltd., 1985, pp. 185–190, Apr. 20, 1960.

"Effects of Aspect Ratio of Lead Zirconate Titanate on 1–3 Piezoelectric composite Properties"; Japan J. Appl. Phys. vol. 36; pp. 6062–6064, May, 1997.

* cited by examiner

*Primary Examiner*—Thomas M. Dougherty
(74) *Attorney, Agent, or Firm*—Frishauf, Holtz, Goodman, Langer & Chick, P.C.

(57) ABSTRACT

An ultrasonic transducer comprising, a piezoelectric block which is formed into a plurality of piezoelectric segments by way of one or more slots, spaced apart, on one main surface of the block, the segments being connected with each other at one and the other of the opposed main surfaces of the block, an organic filler filled at least partially in the slots, a first and a second electrodes formed respectively on the one and the other of the continuous main surfaces of the segments, an acoustic matching layer formed on the one main surface of the piezoelectric block, and a backing material formed on the other main surface of the piezoelectric block.

6 Claims, 5 Drawing Sheets

FIG. 5
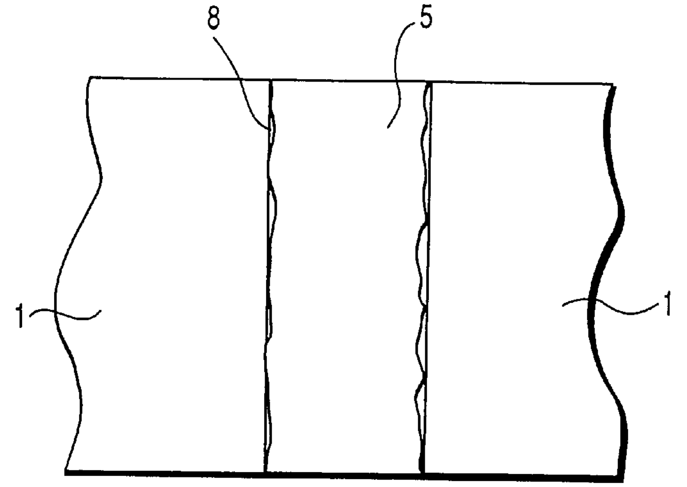
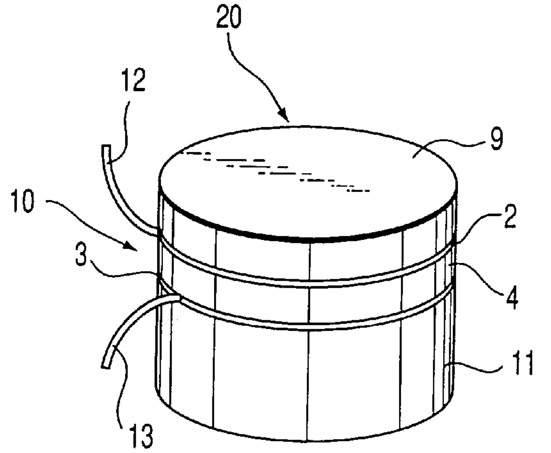
FIG. 6A
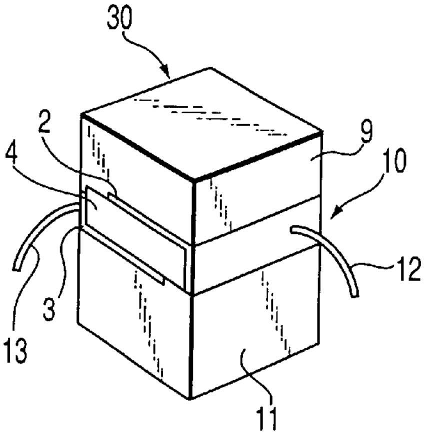
FIG. 6B
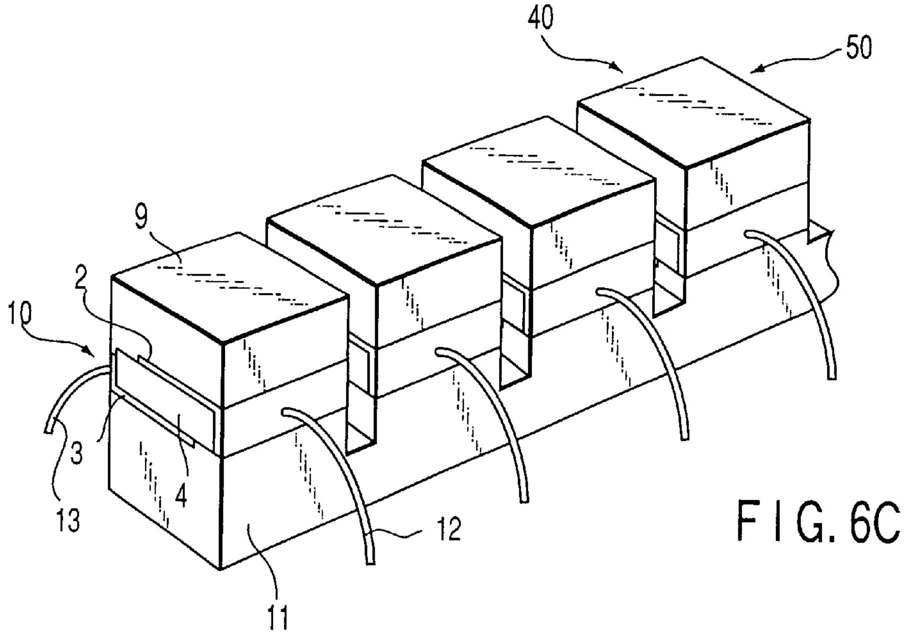
FIG. 6C

ULTRASONIC TRANSDUCER AND METHOD FOR MANUFACTURING THE SAME

BACKGROUND OF THE INVENTION

This invention relates to an ultrasonic transducer for use in the acquisition of a cross-sectional image of a living body for a medical diagnosis, and in the measurement of the living body, or in a non-destructive examination, and also relates to a manufacturing method of the ultrasonic transducer.

An ultrasonic transducer is designed to transmit an ultrasonic pulse to an object and to receive a reflected signal (echo) from the object. The object may be a living body. It is possible through an analysis of the echo to obtain information with respect to the object.

The construction of the ultrasonic transducer is described for example in "Hand Book of Medical Ultrasonic Equipments" (Nippon Electronic Mechanical Industries Association; Corona Publishing Co., Ltd., 1985, 4/20, pp186–190).

The ultrasonic transducer fundamentally comprises a piezoelectric body, an acoustic matching layer and a backing material. The piezoelectric body is provided on the opposite surfaces thereof with electrodes and is designed to convert an ultrasonic pulse and echo respectively to a voltage pulse. The body may be a piezoelectric ceramic formed in a board. The acoustic matching layer is designed to reduce a transmission loss in the ultrasonic pulse between the object such as the living body and the transducer. The backing material is designed to shorten the wave-shape of the pulse to improve the resolution of the transducer. In addition to the above members, an acoustic lens for converging the pulse to the object may be disposed in front of the acoustic matching layer.

The ultrasonic transducer can be operated as follows. A hundred to several hundreds volts of a driving voltage pulse is applied from a pulser to the electrodes. The driving voltage pulse can suddenly deform the piezoelectric body due to a reverse piezoelectric effect. The deformation can excite the ultrasonic pulse which is then emitted via the acoustic matching layer and the acoustic lens.

The ultrasonic pulse emitted is then reflected by the object. The reflected pulse from the object re-enters via the acoustic lens and the acoustic matching layer into the piezoelectric body to oscillate the latter. The object may be an interface between tissues of living body when the transducer is used for a medical purpose, or a discontinuous portion such as a flaw inside a measuring object when the transducer is employed for a non-destructive examination. The mechanical oscillation of the body generated by the re-entered pulse can be converted by way of piezoelectric effect into an electric signal which is then transmitted to a monitoring device to produce an image.

The ultrasonic pulse is generally converged into an ultrasonic beam to be scanned over an object to produce an object image.

Two systems, for example, are known for converging the ultrasonic pulse into ultrasonic beam. In a first system, the front surface of the body is curved to converge the beam to a geometric center of the curvature, or an acoustic lens is disposed in front of the body through which the beam is converged. In a second system, the transducer is formed of a plurality of very small transducer elements which are driven with a phase shift between them so as to converge the beam.

The method for scanning the ultrasonic beam may be following two systems.

In a first system, an ultrasonic beam can be scanned by actuating one or more transducers, while changing the angle and position of each transducer. This system is called a mechanical scanning system.

In a second system, as mentioned above in reference to the converging method of ultrasonic beam, an transducer is formed of a plurality of very small transducer elements. The beam can be scanned by selectively driving those elements individually or in group with phase differences between them. This transducer is called an array type or electronic scanning type ultrasonic transducer.

The electronic scanning type ultrasonic transducer is generally composed of several tens to several hundreds elements, each having a very small width of 0.5 to 1.5 mm, or less than 0.5 mm, which are arranged on a flat or curved surface. Each element is also fundamentally consisted of a piezoelectric body with electrodes on the opposite surfaces thereof, an acoustic matching layer and a backing material. Generally, the piezoelectric body in each element is further divided into 2 to 3 sub-bodies each being rod-shaped for example. Division of the piezoelectric body into sub-bodies can suppress the generation of oscillation modes other than the thickness mode. Since those oscillation modes do not contribute to the transmitting and receiving the ultrasonic waves, they are required to be suppressed. Further, the division into sub-bodies can minimize the loss in transmission of ultrasonic pulses, and improve the electromechanical coupling factor and piezoelectric constant of the body.

In the ultrasonic transducer of mechanical scanning type, the same effects can also be obtained by dividing the body into sub-bodies.

In recent years, a composite piezoelectric body has been increasingly employed in place of a single piezoelectric body, which combines a sub-body or a rod-shaped body and a resin. The employment of the composite body can further minimize the loss in transmission of the ultrasonic pulses which might be caused by a difference in acoustic impedance between the piezoelectric body and the living body, and suppress useless resonance modes, and improve the electromechanical coupling factor and piezoelectric constant of the ultrasonic body.

The composite body can be employed in an ultrasonic transducer of both the mechanical scanning system and electronic scanning type.

The composite piezoelectric body employing a sub-body or a rod-shaped body can be manufactured by dicing a single piezoelectric body. This method is explained for example in Japanese Patent Unexamined Publication No. S60-85699 (hereinafter, referred to as a prior art 1). The dicing method involves the following procedures. First of all, a bulk piezoelectric body consisting of for example lead zirconate titanate (PZT) is adhered to a substrate with an adhesive. Then, the bulk body is diced into a stripe or matrix pattern on the substrate with a dicing device. The groove portion formed as a result of the dicing is filled with a resin such as epoxy resin or urethane resin, and then, the resin is allowed to cure. After the curing, the bulk body diced in this manner is removed from the substrate, thereby obtaining a desired composite body. This method includes two different procedures for obtaining an ultimate composite body. One of the procedures involves the steps of dicing a piezoelectric body, filling the diced groove with a resin, and removing the body from the substrate after the resin has been sufficiently cured, thus obtaining a desired composite body. The other procedure involves the steps of dicing incompletely a piezoelectric body, filling the diced groove portion with a resin, removing the body from the substrate after the resin has been sufficiently cured, and grinding or slicing the body thereby to obtain a desired composite body.

The composite body employing rod-shaped piezoelectric body can be obtained also by producing a fine structure of piezoelectric body with a micromachining technology. This method is described for example in "Jpn. J. Appl. Phys."; Vol. 36(1997), pp.6062–6064 (hereinafter, referred to as a prior art 2). The prior art 2 discloses a method wherein a deep X-ray lithography and a resin molding are combined to obtain a rod-shaped bodies of a high aspect ratio.

More specifically, a resist film having a thickness of 400 μm and consisting of MMA (methyl methacrylate)/MAA (methacrylic acid) copolymer is coated on a substrate.

Then, a synchrotron radiation is irradiated through a mask onto the resist film, followed by development of the film, thereby obtaining a resist structure having a plurality of openings. Thereafter, using the resist structure as a resin mold, a PZT slurry is poured into the openings. The PZT slurry is consisted of a PZT powder, a binder and water.

Further, the PZT slurry is allowed to dry and cure at room temperature to obtain a PZT green body. Then, only the resin mold is removed with an oxygen plasma to leave the PZT green body. The PZT green body thus left is next subjected to a calcinating treatment (removal of the binder) at 500° C., and then to a sintering treatment at 1,200° C. As a result of the sintering, a PZT rod array can be obtained, of which each rod has 20 μm in diameter and 140 μm in height.

Then, the space between the PZT rods is filled with epoxy resin using vacuum impregnation, followed by curing the resin. After curing, the upper and bottom surfaces of the rod array are polished to expose the opposite end faces of the PZT rod, thereby flattening both the surfaces of the array. A gold electrode is deposited by sputtering on the flattened surfaces of the rod array. Then, the array is subjected to poling with a voltage applied onto the electrodes while keeping the array immersed in an oil bath. Thus, a composite piezoelectric body can be provided with a piezoelectric property. The composite body thus obtained can have a frequency constant of not more than 700 kHz·m, and be manufactured in a mini and thin shape.

However, an ultrasonic transducer employing the composite piezoelectric body is accompanied with problems that the wiring to each piezoelectric body is complicated, and the electrodes can easily have breaks during the operation of the transducer.

In order to wire to each sub-piezoelectric body, a wiring is connected either to the electrode of each sub-body, or to a continuous electrode formed over the sub-bodies. On the other hand, in order to wire to each rod-shaped piezoelectric body, a wiring is connected to a continuous electrode formed on a surface including both the end faces of each rod-shaped body and the exposed surface of resin formed between the rods.

The wiring to each sub-body involves a complicated work. As a result, the construction of the resultant ultrasonic transducer as well as the manufacturing steps are complicated. Further, the continuous electrodes occasionally have breaks during the operation of the transducer thereby causing a disconnection of wiring. More specifically, only the sub-bodies or the rod-shaped bodies can oscillate independently, while other members such as the resin oscillate following the movements of the bodies. Therefore, the continuous electrodes may have breaks at the boundary portions between the independently oscillating bodies and the dependently oscillating members.

BRIEF SUMMARY OF THE INVENTION

Therefore, an object of the present invention is to provide an ultrasonic transducer which can facilitate wiring to each piezoelectric body and reduce breaks of electrodes during the operation of the transducer.

Another object of the present invention is to provide a method for manufacturing such an ultrasonic transducer.

The invention provides an ultrasonic transducer comprising;

a piezoelectric block which is formed into a plurality of piezoelectric segments by way of one or more slots, spaced apart, on one main surface of the block, the segments being connected with each other at one and the other of the opposed main surfaces of the block;

an organic filler filled at least partially in the slots;

a first and second electrodes formed respectively on the one and the other of the continuous main surfaces of the segments;

an acoustic matching layer formed on the one main surface of the block; and a backing material formed on the other main surface of the block.

Moreover, the invention provides an ultrasonic transducer consisting of a plurality of ultrasonic transducer elements, each comprising;

a piezoelectric block which is formed into a plurality of piezoelectric segments by way of one or more slots, spaced apart, on one main surface of the block, the segments being connected with each other at one and the other of the opposed main surfaces of the block;

an organic filler filled at least partially in the slots;

a first and second electrodes formed respectively on one and the other of the continuous main surfaces of the segments;

an acoustic matching layer formed on the one main surface of the block; and a backing material formed on the other main surface of the block.

Preferably, the ultrasonic transducer is constructed such that the plurality of the segments are formed of at least one segment capable of oscillating in a thickness mode and at least one segment capable of oscillating in a longitudinal mode.

The invention also provides a method for manufacturing an ultrasonic transducer, which comprises the steps of;

(a) depositing conductive layers all over one and the other of opposed main surfaces of a piezoelectric block to form electrodes thereon;

(b) forming one or more slots passing through the conductive layer on the one main surface of the block, by forming an etching mask and reactive ion etching with a reactive gas comprising a fluoride, so as to form the block into a plurality of piezoelectric segments which are connected to each other on the one and the other main surfaces of the block;

(c) filling at least partially the slots with an organic filler;

(d) forming an acoustic matching layer over the conductive layer formed on the one main surface of the block; and (e) forming a backing material over the conductive layer formed on the other main surface of the block.

Preferably, an etching mask employed in the step (b) is formed of a conductive material and is used as the electrode formed on the one main surface of the block.

It is also preferable in the invention that the forming an etching mask and the reactive ion etching are repeated in the step (b).

It is also preferable in the invention that the step (b) is performed such that the piezoelectric block is taken out of an etching reaction vessel in a midway of the etching, and, after being provided again with a fresh etching mask, is returned to the vessel for resuming the etching of the block.

Preferably, the ultrasonic transducer is constructed such that the piezoelectric block is formed of a piezoelectric single crystal.

It is also preferable that the ultrasonic transducer is constructed such that the piezoelectric block is formed of a relaxor type ferroelectric substance.

It is also preferable that the ultrasonic transducer is constructed such that the relaxor type ferroelectric substance is represented by the following formula:

$$Pb(B'B'')O_3$$

wherein B' is a bivalent or trivalent cation such as manganese (Mg) and zinc (Zn); and B" is a pentavalent or hexavalent cation such as niobium (Nb) and tungsten (W).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 represents a cross-sectional view schematically showing one example of piezoelectric segments provided on the side surface thereof with a fluoride according to the invention;

FIGS. 6A to 6C respectively shows a schematic perspective view of one example of the ultrasonic transducer according to the invention;

DETAILED DESCRIPTION OF THE INVENTION

Figure 1A:
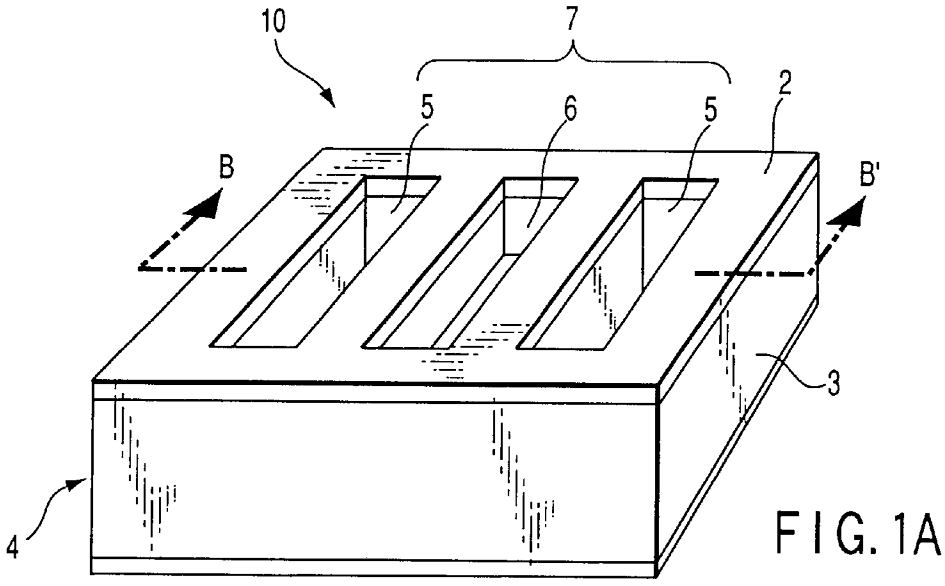
FIG. 1A represents a perspective view schematically showing one example of the composite piezoelectric body with electrodes on the opposite main surfaces thereof according to the invention.

The ultrasonic transducer according to the invention includes an ultrasonic transducer of mechanical scanning system and a transducer of electronic scanning system. The ultrasonic transducer of mechanical scanning system constitutes a single ultrasonic transducer element, while the ultrasonic transducer of electronic scanning system constitutes a plurality of ultrasonic transducer elements.

Each transducer element is fundamentally consisted of a composite piezoelectric body provided on the opposite surfaces thereof with electrodes, an acoustic matching layer, a backing material, and optionally an acoustic lens.

The composite piezoelectric body bearing electrodes thereon comprises a plurality of piezoelectric segments, an organic filler at least partially filling the slots distinguishing the segments, and a common electrode formed on each segment. As will be explained, the piezoelectric segments can be formed by making use of at least one slot (or elongated hole) on the surface of the block. The slot has a length which is larger than the width thereof, and is preferably closed at both ends.

The piezoelectric block can be generally of cylindrical column or rectangular parallelepiped. The block may be formed of a piezoelectric ceramic. The piezoelectric ceramic may be lead zirconate titanate (PZT) type ceramics, lead zinc niobate-lead titanate (PZN-PT) type ceramics, lead magnesium niobate-lead titanate (PMN-PT) type ceramics, etc. The PZT type ceramics can have a frequency constant of about 2,000 Hz·m in Nt, and about 1,300 Hz·m in N33.

The piezoelectric block can be obtained from a sintered powder of the piezoelectric ceramic materials, or a ground or sliced single crystal of the ceramic material such as a single crystalline solid solution. The block thus obtained can have such a high density as to obtain an ultrasonic transducer which is high in density and in resolution. The piezoelectric body can preferably be obtained from the ground or sliced single crystal of the ceramic material. It is because, the single crystal is higher in orientation and in density and is more excellent in piezoelectric property than the sintered powder. Therefore, an ultrasonic transducer is manufactured from a block of a single crystal can have an improved S/N ratio and a high resolution.

When manufacturing the block from the single crystal, the crystal orientation should be taken into account. For example, the single crystal should be ground or sliced in such a manner that the most desirable crystal orientation for the piezoelectric property, e.g. <111> is aligned with the direction of height (thickness) of the piezoelectric segment.

The piezoelectric block is provided, on one main surface thereof, with one or more slots. The slots may constitute only through-slots which pass through the block, or only nonthrough-slots (groove) which do not pass the block, or constitute the both. The depths of the non-through slots should preferably be about 80% or more of the height of the block. The piezoelectric segments distinguished by the nonthrough-slots of such depths can obtain almost the same piezoelectric properties (such as electromechanical coupling factor) as those of the segments distinguished by the through-slots. The slots may be straight or curved. The widths of the slots may be the same throughout the entire length or be varied along the length. The varied widths of the slots may be monotonously increased or decreased ones, or repeatedly increased or decreased ones along the length. The varied widths of the slots can enhance the adhesivity between the organic filler and the piezoelectric segments and can enlarge the frequency band width.

The slots can be arranged on the block in the following first to fourth styles. In the first style, straight slots are arranged substantially parallel with each other and substantially equidistantly spaced apart from each other. In the second style, straight slots are arranged substantially parallel with each other and variously spaced apart from each other. In the second style, the interval between neighboring slots can be varied periodically or non-periodically. In the third style, straight slots are arranged non-parallel with each other. In the fourth style, curved slots of the same or different configuration from each other are arranged.

As will be explained, the slots can be formed by dry-etching a piezoelectric block with a plasma of a reactive gas useful for the etching. The slots can be formed in any desired configuration by adjusting the etching conditions including the temperature of substrate, gas pressure, induction power, etc.

As mentioned above, the piezoelectric segments can be manufactured from the piezoelectric block by way of one or more slots, spaced apart, on the block. Each segment is distinguished from each other by way of the slots, while being connected with each other at one main surface (front surface) of the block, on which slots are formed, and at the other main surface (back surface) of the block. The construction where the segments are connected with each other at the front and back surfaces of the block should be understood as following. The segments are connected to each other in the regions where the slots are not formed, and they are not separate from each other. In other words, the block is continuous in the regions where the slots are not formed, so that the block is not completely divided by the slots. Each segment can be defined by two neighboring slots. The configuration of the segment is not like that of a columnar body of which the entire surface is isolated from the surfaces of the neighboring bodies.

Thus, the front surface of each segment is connected with each other, which is ditto for the back surface. As a result, continuous common electrodes can be formed on the front and back surfaces of the segments as explained later. Thus, the wiring to each segment can be completed by connecting to only one point on each common electrode, not by connecting to every segment. Therefore, the wiring can be simplified. Further, the common electrodes may not be formed on the organic fillers filled in the slots. Even when the electrodes are formed on both the segments and fillers, the following advantages can be obtained. The common electrodes can work without any difficulties even in the case of disconnection at boundary portions between the segments and the fillers during the operation of the transducer. It is because the common electrodes are still connected at the regions of the segments.

The piezoelectric segments can preferably include at least one segment capable of oscillating in a thickness mode and at least one segment capable of oscillating in a longitudinal mode. In the thickness mode, the frequency of oscillation is regulated by the thickness or the height of the segment. In the longitudinal mode, the frequency of oscillation is regulated by the width of the segment. Those modes have different frequency constants. Therefore, an ultrasonic transducer containing both modes of oscillation can enlarge the frequency band width and improve the S/N ratio. As a result, the ultrasonic transducer can have both a deep depth of field and a high resolution.

The width or height of each segment can be adjusted to provide the segments of above two modes. Specifically, the segments of PZT type piezoelectric ceramics can oscillate in the thickness mode, if the widths of the segments are not more than about 0.6 time as much as the heights thereof. On the contrary, if the widths are not less than about 0.6 time as much as the heights, the segments can oscillate in the longitudinal mode.

The width and height of each segment can be adjusted by forming the segments by using the second to forth styles of the slots. In the second style of slots, the interval between neighboring slots can be varied, while in the third and fourth styles, the neighboring slots may not be parallel to each other. Therefore, the second to forth styles of slots can be used with adjusted shapes and arrangements to form segments in both thickness and longitudinal modes.

The side walls of the segments that are to be contacted with the organic filler should preferably be featured as follows. (a) the side walls are tapered; (b) the side walls are not smooth but formed into rugged surfaces; and (c) fluorides are deposited on the side walls. The side walls with above features can enhance the adhesivity between the segments and the filler due to the anchoring effect. Further, the oscillation modes other than the thickness mode can be suppressed to minimize the useless oscillations of the segments. An ultrasonic transducer using such segments can improve the S/N ratio and a high resolution.

As set forth below, the tapers on the side walls of the segments can be achieved by an ICP (inductively coupled plasma) etching of the piezoelectric block. The rugged surface on the side walls of the segments can be achieved by a deep RIE (reactive ion etching) of the block. The fluorides can be deposited on the side walls of the segments by etching the block with a reactive gas containing a fluoride.

The fluorides can be formed non-uniformly on the side walls, e.g., in a mesh-like pattern or a dot-like pattern with random sizes and thicknesses. The fluorides may be lead fluorides ($PbF_x$) (x is a composition ratio), zirconium fluorides ($ZrF_x$), yttrium fluorides ($YF_x$), etc. The sizes and thicknesses of the fluorides can be measured with a scanning electron microscope (SEM). The compositions of the fluorides can be measured with a SEM·DX (energy dispersive X-ray spectroscopy of a scanning electron microscope). The sizes, thicknesses, compositions of the fluorides can be adjusted with the etching conditions of the piezoelectric segments.

The filler to be filled in the slots may be any organic filler which can exhibit a high adhesion strength in relative to the segments. The organic filler of flexible is preferable. Such an organic filler may be a resin like an epoxy resin, urethane resin, silicone resin, etc. The epoxy resin may preferably be those which can cure at room temperature to exhibit a Shore hardness of A90 or so.

The organic filler can preferably be formed of the same material as that of the acoustic matching layer, the backing material, or an adhesive employed to bond the acoustic matching layer or the backing material to the electrodes. Thus, less kinds of materials can be needed to produce the ultrasonic transducer.

The common electrodes formed continuously over the segments are consisted of a first and second common electrodes. The first electrode is designed to be electrically connected to the one main surface of the segments which are provided with the slots. The second electrode is designed to be electrically connected to the other main surface. Those electrodes are merely required to be formed at least on the surfaces of the segments. Those electrodes may not be formed on the surface of the filler filled in the slots.

The electrodes may be of conductive materials such as metallic materials and compound materials. Metallic materials can be metallic simple substances such as gold, copper, titanium, nickel, silver, platinum and chromium; and a laminate body of a combination of the above substances, such as chromium/gold. Compound materials can be ITO (indium tin oxide). The electrodes can be formed using electrolytic plating, sputtering, vapor deposition, ion-plating.

The acoustic matching layer may be formed of resins such as silicone resin, epoxy resin, urethane resin, polyimide, PEEK, polyethylene, fluororesin, etc.; a mixture comprising any one of those resins and particles of ceramics such as alumina, zirconium, etc., or a mixture of resins and particles of a metal or a glass; ceramics; glass; crystalline glass; or silicon.

The backing material may be formed of resins such as silicone resin, epoxy resin, urethane resin, polyimide, PEEK, polyethylene, fluororesin, etc.; or a mixture comprising any one of those resins and particles of ceramics such as alumina, zirconium, etc., or mixture of resins and particles of a metal or a glass.

The acoustic matching layer and the backing material may be manufactured by casting the above materials into a mold. The acoustic matching layer and the backing material may be bonded to the electrodes with an adhesive. The adhesive can be formed of a resin such as silicone resin, epoxy resin, urethane resin, polyimide and urethane resin.

The ultrasonic transducer according to the invention can be manufactured using a dry etching method as following.

First of all, the entire surface of one (the front surface) and the other (the back surface) of a piezoelectric block are provided with a conductive layer (a front and back conductive layers) for forming electrodes. The back conductive layer can preferably be formed of a material exhibiting a lower etching rate than that of the material for the block. Thus, the endpoint of the etching can be controlled with the back conductive layer. The front and back conductive layers may be formed after the organic filler is filled in the slots.

Then, an etching mask is formed on the front conductive layer.

The etching mask may be formed of any material which has an etching rate lower than that of the material for the block. The materials for the mask may be a metallic material or a compound material.

Metallic material includes nickel (Ni). Compound material includes an organic material and an inorganic material. The organic material may be a resin such as a photoresist resin. The inorganic material may be silicon oxide ($SiO_2$), silicon nitride ($Si_3N_4$), etc.

The mask may be formed on the surface of the front conductive layer by depositing any one of the above materials with a coating method, a CVD method, an electrolytic plating method or sputtering method. The resin film can be formed with the coating method. The film consisting of the silicon oxide or silicon nitride can be formed with the CVD method. The film consisting of the metallic material such as nickel can be formed with the electrolytic plating or the sputtering method.

Then, the piezoelectric block is etched through the mask so as to form the slots which pass through the front conductive layer into the block.

The etching may be terminated before the slots pass through the block, or may be continued until the slots pass through the block. When the slots are to be formed not to pass through the block, the depth of those nonthrough-slots can preferably be about 80% or more of the height of the block. When the slots are to be formed to pass through the block, the etching may be terminated when the holes reach the back conductive layer, or may be continued until the back conductive layer is completely penetrated by the slots. As explained above, in the former case, the back conductive layer can determine the end point of the etching.

The etching may be performed by way of a wet etching such as a laser assist etching or by way of a dry etching using the plasma of a reactive gas. Forming the etching mask and the etching may be repeated.

The laser assist etching is an etching method wherein YAG laser is irradiated onto a piezoelectric block while the block is immersed in an etching solution of potassium hydroxide (KOH), thereby etching off the irradiated portion. In this method, a mask may not be formed on the surface of the block.

The dry etching is an etching method wherein a radical of a reactive gas is employed for the etching. The dry etching method is well known among those skilled in the art. The reactive gas for generating the radical may be a fluoride such as sulfur hexafluoride ($SF_6$), carbon tetra fluoride ($CF_4$), etc. $SF_6$ is preferable than $CF_4$, because the etching rate of $SF_6$ is larger than that of $CF_4$. As mentioned above, the etching using the reactive gas comprising a fluoride can deposit fluorides on the side walls of the piezoelectric segments. Further, as mentioned above, the sizes of the fluorides may be adjusted by suitably selecting the etching conditions.

The dry etching method may be a reactive ion etching (RIE) method, ICP (inductively coupled plasma) etching method and a deep RIE method.

The RIE method utilizes both radical and neutral active species of a reactive gas. The ICP method is a method where electrons are accelerated by an inductive electric field generated by a high frequency inductive magnetic field, to generate a plasma of reactive gas. The deep RIE method is a method where a reactive ion etching and a masking are repeated against a piezoelectric block. The etching and masking conditions can be adjusted to form slots having rugged surfaces on the side walls thereof and a having large aspect ratio.

The dry etching method can form very narrow slots in high density in the piezoelectric block. Since piezoelectric segments in fine configurations can be formed by way of such small slots, an ultrasonic transducer can be produced in a small configuration and in high resolution. Further, the dry etching can make the segments side walls which contact with filler, free from the adhesion of cut waste or oily matter, thus keeping the walls clean. The dry etching can also reform the walls. Therefore, the adhesive strength between the segments and the filler would be increased, resulting in an improvement in durability of the ultimate ultrasonic transducer. Further, the clean and reformed side walls of the segments can improve the strength against the bending of the composite piezoelectric body. Thus, the composite piezoelectric body can be deformed into various complicated configuration.

A conductive protective film may be formed all over the block after the organic fillers filled in the slots are cured. The protective film can be formed to cover the conductive layer on the segments and the filler surface exposed in the openings of the layer. The protective film can prevent the segments and the first and second common electrodes from being damaged during the operation of the transducer, and can prevent the electrodes from being oxidized by the outside air. The damage of the segments during the operation may be mainly attributed to the segments damage occurred during the etching process.

In the foregoing description, various embodiments of the invention have been explained. The invention also includes the following aspects.

The invention includes an ultrasonic transducer which is featured in that the etching mask material to be employed in the plasma etching is formed of a conductive material, and in that the mask functions as an electrode to be disposed on the surface of a composite piezoelectric body, and a method for manufacturing such an ultrasonic transducer.

The invention includes an ultrasonic transducer which is featured in that the etching mask material to be employed in the plasma etching is formed of a conductive material, and in that the mask functions as an electrode disposed on the surface of a composite piezoelectric body, and a method for manufacturing such an ultrasonic transducer.

The invention also includes an ultrasonic transducer which is featured in that the piezoelectric block or the piezoelectric segment is formed of a piezoelectric single crystal, and a method for manufacturing such an ultrasonic transducer.

The invention also includes an ultrasonic transducer which is featured in that the piezoelectric block or the piezoelectric segment is formed of a relaxor type ferroelectric substance, and a method for manufacturing such an ultrasonic transducer. The relaxor type ferroelectric substance denotes generally a perovskite compound containing lead (Pb) and represented by the following formula:

$$Pb(B'B'')O_3$$

wherein B' is a bivalent or trivalent cation such as manganese (Mg) and zinc (Zn); and B" is a pentavalent or hexavalent cation such as niobium (Nb) and tungsten (W).

The relaxor type ferroelectric substance is higher in electromechanical coupling factor than the PZT type materials. The piezoelectric body formed of the relaxor type ferroelectric substance can improve the piezoelectric property of the resultant composite piezoelectric oscillator.

The invention also includes a method of manufacturing an ultrasonic transducer which is featured in that the step of manufacturing a composite piezoelectric body bearing electrodes is performed such that the piezoelectric block is taken out of an etching reaction vessel in a midway of the etching, and, after being provided again with a fresh etching mask, is returned to the vessel for resuming the etching of the block.

The invention also includes a method of manufacturing an ultrasonic transducer which is featured in that the steps of manufacturing a composite piezoelectric body bearing electrodes are performed such that the forming etching mask and the reaction ion etching are repeated.

Figure 1B:
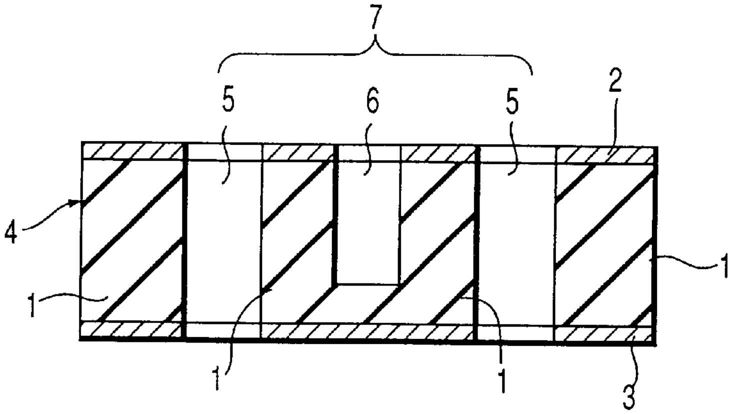
FIG. 1B represents a cross-sectional view schematically showing one example of the composite piezoelectric body with electrodes on the opposite main surfaces thereof according to the invention.

FIGS. 1A and 1B schematically illustrate examples of a composite piezoelectric body provided on the opposite main surfaces thereof with electrodes according to the invention. Specifically, FIG. 1A represents a perspective view schematically showing one example of the composite piezoelectric body in an external shape of rectangular parallelepiped. FIG. 1B represents a cross-sectional view along the line B–B' of FIG. 1A.

The composite piezoelectric body 10 bearing electrodes comprises a plurality of piezoelectric segments 1, an organic filler, a first electrode 2, and a second electrode 3. A piezoelectric block 4 is formed into the piezoelectric segments 1 by way of through-slots 5 or nonthrough-slots 6. The through-slots 5 and nonthrough-slots 6 may be hereinafter referred to generally as a hole 7. The electrodes 2 and 3 are formed on each piezoelectric segment 1. The organic filler is filled in the slots 7 which are disposed to distinguish the segments 1. In FIG. 1, the organic filler is omitted for convenience sake.

Figure 2A:
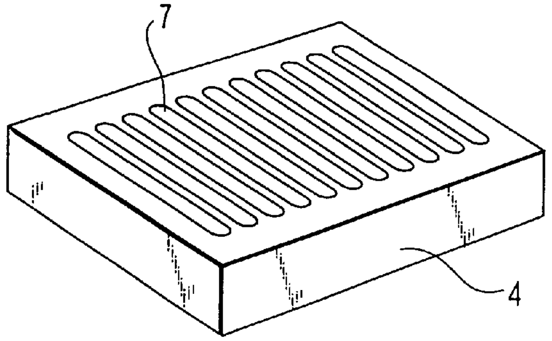
FIGS. 2A and 2B respectively shows a schematic perspective view illustrating one example of the configuration of slots formed on the piezoelectric block according to the invention.
Figure 2B:
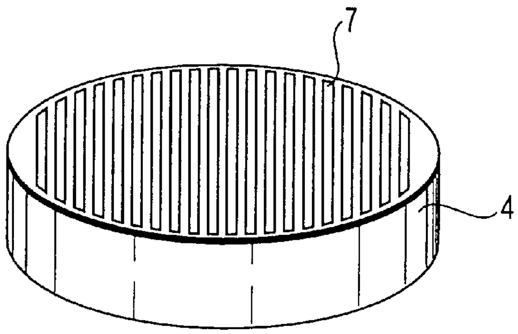
Figure 3A:
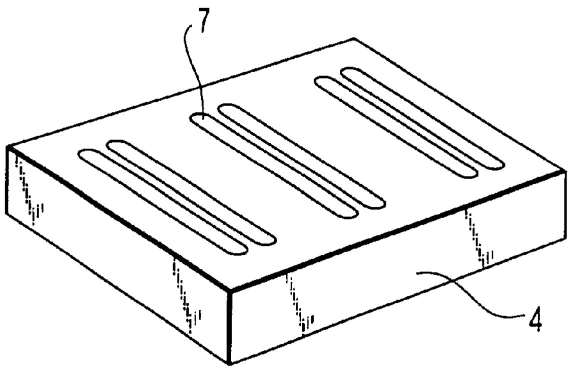
FIGS. 3A and 3B respectively shows a schematic perspective view illustrating another example of the configuration of slots formed on the piezoelectric block according to the invention.
Figure 3B:
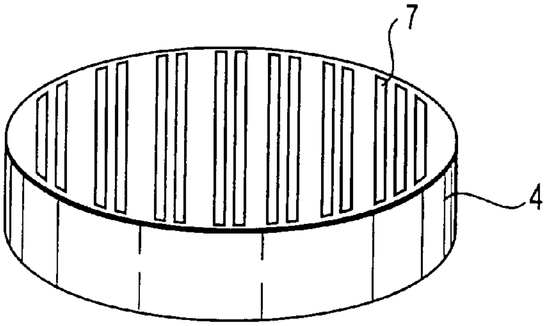
Figure 4A:
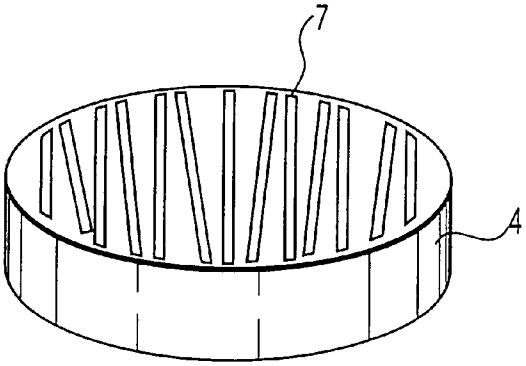
FIGS. 4A and 4B respectively shows a schematic perspective view illustrating still another example of the configuration of slots formed on the piezoelectric block according to the invention.
Figure 4B:
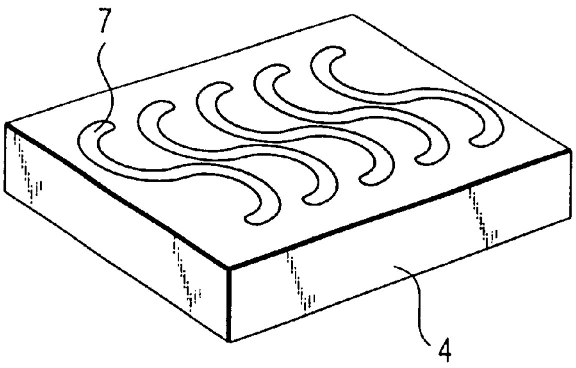

FIGS. 2A to 4B illustrate the slots 7 formed in the block 4 in the first to fourth styles. FIGS. 2A, 3A and 4B schematically illustrate perspective views of slots 7 in an external configuration of rectangular parallelepiped. FIGS. 2B, 3B and 4A schematically illustrate perspective views of slots 7 in an external configuration of columnar body. FIGS. 2A and 2B illustrate examples of slots 7 in the first style. FIGS. 3A and 3B illustrate examples of slots 7 in the second style. In FIG. 3A, the interval between neighboring slots 7 is periodically varied along the arranged direction of the slots 7. In FIG. 3B, the interval between neighboring slots 7 is non-periodically varied along the arranged direction of the slots 7. FIG. 4A illustrates one example of slots 7 in the third style, wherein the neighboring straight slots 7 are arranged not to be parallel. FIG. 4B illustrates one example of slots 7 in the fourth style, wherein the curved slots 7 in almost the same configuration are arranged.

FIG. 5 is a cross-sectional view schematically illustrating, as one example, a state where fluorides 8 are deposited on the side walls of the segments 1 which are distinguished by through-slots 5. The fluorides 8 are closely deposited on the side walls, forming rugged surfaces on the walls.

Each ultrasonic transducer element can be obtained by bonding an acoustic matching layer and a backing material onto the composite piezoelectric body 10 bearing electrodes as shown in FIG. 1. The ultrasonic transducer according to the invention can be produced from the elements.

FIGS. 6A to 6C respectively show a schematic perspective view of one example of the transducer according to the invention. Specifically, FIGS. 6A and 6B respectively shows a transducer of mechanical scanning system. FIG. 6C shows a transducer of electronic scanning system. The transducer shown in FIG. 6A is in a columnar external shape and composed of a single body of transducer element 20. The transducer shown in FIG. 6B is shaped in a rectangular parallele-piped and composed of a single body of element 20. The transducer shown in FIG. 6C is composed of a plurality of linearly arranged transducer elements 40.

Specifically, FIG. 6C shows a type of transducer wherein the backing material is common.

The elements 20, 30 and 40 are constructed as follows. An acoustic matching layer 9 is bonded to the common electrode 2 formed on the sound-emitting side of the body 10. A backing material 11 is bonded to the common electrode 3 formed on the back side of the body 10. The body 10 with electrodes on the opposite surfaces, the acoustic matching layer 9 and the backing material 11 are integrated as a whole. The body 10 has the piezoelectric block 4 between the common electrodes 2 and 3. The block 4 is formed into a plurality of piezoelectric segments. In the elements 30 and

40, the common electrodes 2 and 3 are also formed on the side walls of the block 4 to facilitate the wiring to the electrodes 2 and 3.

The common electrode 2 is connected with GND (ground) lead wire 12 using a low temperature solder or a conductive resin. The common electrode 3 is connected with a lead wire 13 for external signals using a low temperature solder or a conductive resin.

In the elements 20 and 30 shown in FIGS. 6A and 6B, the body 10 is shaped in a column or a parallelepiped, wherein the acoustic matching layer 9 and the backing material 11 are respectively formed in a single layer. Those elements may also have other structures. For example, the body 10 may be in a curved configuration such as a cylindrical shell-like or a spherical shell-like shape. Further, the acoustic matching layer 9 and the backing material 11 may be formed in a multi-layer. Additionally, the transducer elements 20, 30 may further comprise an acoustic lens.

In the transducer 50 shown in FIG. 6C, the elements 40 are linearly and flatly arranged, the backing material 11 is common, while the acoustic matching layers 9 are separated from each other. The transducer 50 may also have other structures. For example, the element 40 may be arranged on a curved surface such as a cylindrical or a partially cylindrical surface. Further, the acoustic matching layers 9 may be partially connected with each other.

Next, one example of the manufacturing method of the ultrasonic transducer according to the invention will be explained with reference to FIGS. 7A to 9E.

Figure 7A:
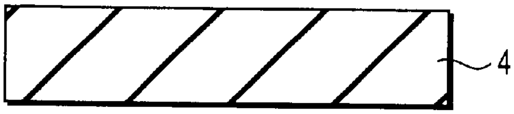
FIGS. 7A to 7H are cross-sectional views schematically illustrating the steps of manufacturing a composite piezoelectric body with electrodes on the opposed main surfaces thereof according to one example of the manufacturing method of the invention.

As shown in FIG. 7A, a piezoelectric block 4, i.e. a bulk piezoelectric body is prepared at first.

The block 4 can be obtained from a sintered powder of piezoelectric ceramic materials, or from a ground or sliced single crystal of a ceramic material.

Specifically, the block 4 can be produced by way of a well-known sintering method in the art. For example, the powders of the ceramic materials are suitably mixed to obtain a desired composition, and then the resultant mixture is calcinated. Then, the calcinated mixture is pulverized and mixed with a binder to improve the moldability. The resultant mixture is then graded to obtain a graded mixture, which is then pressed to obtain ceramic pellets. The pellets are then heated at 600° C. to remove organic substances which remain therein. Thereafter, the pellets are subjected to a hot press at 1,200° C. to obtain a sintered body. The sintered body is then molded using a slicer, a surface grinder, and, if required, a double lapping machine to obtain a piezoelectric block 4. The height (thickness) of the block 4 may be about 100 $\mu$m for the block 4 of a PZT type material.

Figure 7B:
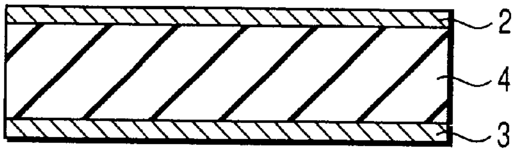

Then, as shown in FIG. 7B, conductive material layers 2 and 3 are deposited respectively over the entire front surface (where a mask is to be formed) and the entire back surface opposite to the front surface to form common electrodes. The layer 2 on the front surface corresponds to the first common electrode, while the layer 3 on the back surface corresponds to the second common electrode.

Those front and back conductive material layers 2, 3 can be formed in such a way that chromium (Cr) and gold (Au) are successively deposited by sputtering to form a multi-layer of Cr/Au.

Then, an etching mask for the block 4 is formed on the front layer 2. The mask may be in a pattern having elongated narrow openings of each width of about 20 $\mu$m with a thickness of 100 $\mu$m. Thereafter, the block 4 is etched through the mask to form the slots 7. The etching mask can be provided as follows.

Figure 7C:
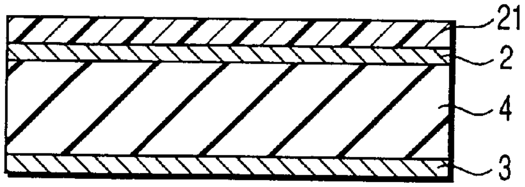

First, as shown in FIG. 7C, a resin photoresist layer 21 is coated on the front layer 2.

Figure 7D:
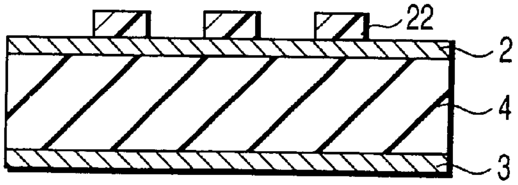
Figure 7E:
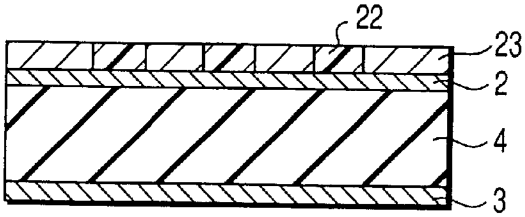

As shown in FIG. 7D, the photoresist layer 21 is exposed using a pattern which has openings corresponding to the location and configuration of desired slots 7. Then, the photoresist layer 21 is developed to form a patterned resist layer 22. Then, as shown in FIG. 7E, the block 4 is immersed in a nickel ion solution, and a negative voltage is applied to the front layer 2 to perform an electrolytic nickel plating. The electrolytic nickel plating can form a nickel film 23 of a large thickness within a relatively short period of time. Thus, the nickel film 23 can be formed on the portions of the front layer 2 which are exposed in the openings of the layer 22. The nickel film 23 formed corresponds to the locations of piezoelectric segments 1.

Figure 7F:
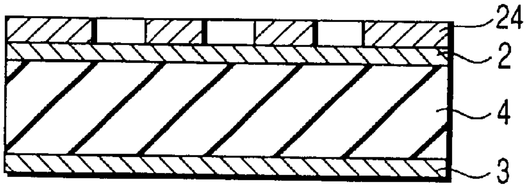

Finally, as shown in FIG. 7F, the resist layer 22 is removed with a solvent to leave a patterned nickel film 24 on the front layer 2, which can be used as an etching mask. This nickel film 24 is formed in a pattern which has openings in conformity with the slots 7. The nickel film 24 can also function as a portion of electrode on the segments 1, in addition to the front layer 2.

Then, the block 4 is etched through the nickel film 24 to form the slots 7 which pass the front layer 2 into the block 4.

The aforementioned various dry etching methods to form the slots 7 will be explained below.

Figure 7G:
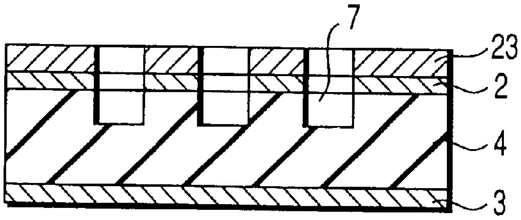
Figure 7H:
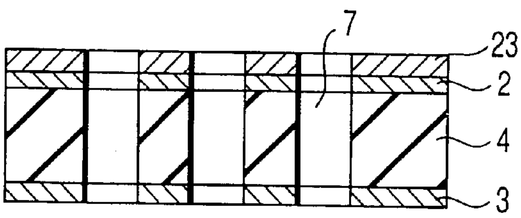

FIGS. 7G to 7H show examples of etching process in an RIE method. By etching the block 4 in RIE method, the segments 1 side walls 1 which face the slots 7 can be made parallel with the depth-wise direction of the slots 7. The etching conditions can be adjusted to obtain the piezoelectric segments 1 which have side walls of any desired configuration.

Figure 8A:
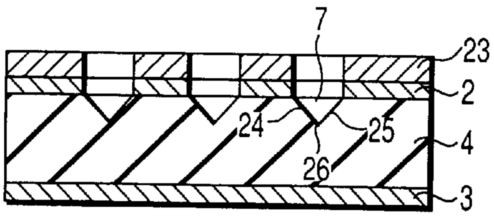
FIGS. 8A and 8B are cross-sectional views schematically illustrating the steps of manufacturing a composite piezoelectric body with electrodes on the opposed main surfaces thereof according to another example of the manufacturing method of the invention.
Figure 8B:
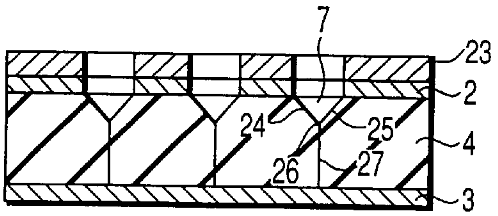

FIGS. 8A to 8B show examples of etching process in an ICP method. The etching process in the ICP method shown in FIGS. 8A and 8B can substitute for the etching process in the RIE method in FIGS. 7G and 7H. The etching conditions of the ICP method can be adjusted to taper the side walls of segments 1. The etching conditions in the ICP method may be that $SF_6$ gas is used for the reactive gas at −400V in self-bias, 10 mTorr in gas pressure and −50° C. of the block during the etching. The etching can be performed in a magnetic field.

The etching conditions such as the induction power can be adjusted to form slots 7 in a configuration as shown in FIG. 8A. In FIG. 8A, the side walls 24, 25 inclined in relative to the depth-wise direction of the slots 7 contact at the bottom of the slots 7 to form one side 26. As a result, the cross-section perpendicular to the depth-wise direction of the slots 7 are tri-angulars with one of the tops directed downward.

Further, the etching conditions can be adjusted to form a gap 27 shown in FIG. 8B in the block 4. In FIG. 8B, very narrow gaps 27 (for example, several tens nanometers to several micrometers in depth and about 50 micrometers in length) are formed further extending straightly downward from the sides 26 which are formed at the bottoms of the slots 7. The very narrow gaps 27 at the bottoms of the slots 7 can distinguish a plurality of the segments.

When the gaps 27 are formed at the bottoms of the slots 7, an organic filler of such a sufficiently high viscosity will be filled in the slots 7 so as to avoid the filler from entering into the gaps 27 of widths of not more than several micrometers. As a result, the gaps 27 will not be filled with the organic filler but filled with the air.

Thus, the segments 1 are distinguished by the narrow air gaps 27 so that the segments 1 are placed in a high density of several micrometers in interval and are oscillatingly isolated. An ultrasonic probe employing such segments 1 can realize a high S/N ratio and a high transmission/receiving efficiency.

FIGS. 9A to 9E show examples of etching process in a deep RIE method. The deep RIE method in FIGS. 9A to 9E can substitute for the RIE method in FIGS. 7G and 7H. The deep RIE method can be performed using a reactive gas for etching as well as a gas for forming ions for generating a masking film. The masking gas may be $C_4F_8$.

Figure 9A:
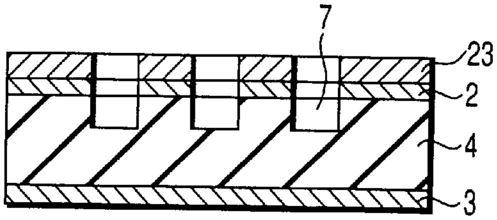
FIGS. 9A to 9E are cross-sectional views schematically illustrating the steps of manufacturing a composite piezoelectric body with electrodes on the opposed main surfaces thereof according to still another example of the manufacturing method of the invention.
Figure 9B:
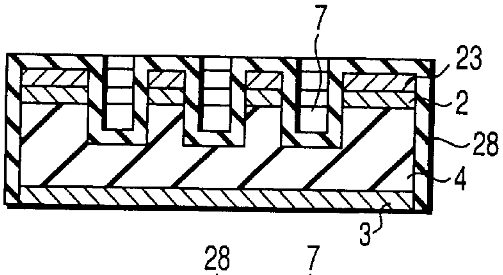
Figure 9C:
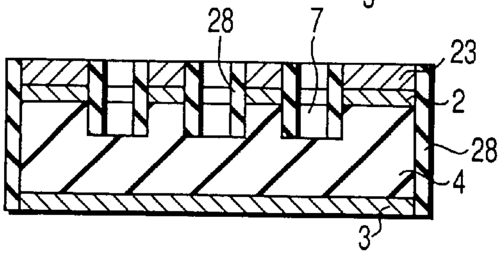

As shown in FIG. 9A, the slots 7 are first of all formed on a surface of a sample using a reactive ion etching. Then, as shown in FIG. 9B, a masking film 28 is formed on the surface which includes the slots 7, by way of a plasma of a masking film-forming gas. Then, as shown in FIG. 9C, a reactive ion etching is performed again over the film 28. As a result of the etching, the upper surface of the nickel film 23 and the bottom surfaces of the slots 7 are etched. However, the side walls of the slots 7 where the etching rate is low are not etched, since the side walls are protected by the film 28. Thus, only the bottom surfaces of the slots 7 are selectively etched to increase the depth of the slots 7.

The procedures of etching and masking shown in FIGS. 9A to 9C can be repeated with adjusted conditions in each step. The time interval between the repeat may be in the range of several seconds to several minutes.

Figure 9D:
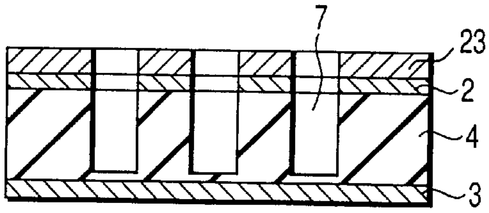
Figure 9E:
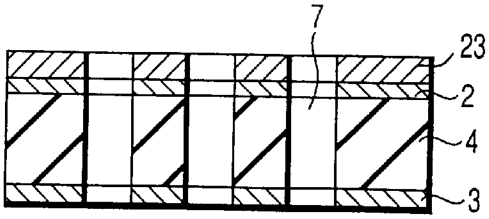

The masking film 28 is then removed to form the slots of a high aspect ratio as shown in FIGS. 9D and 9E. Further, the etching and masking steps can be repeated with adjusting each step conditions to form rugged surfaces on the side walls of the segments 4 which are exposed to the slots 7.

The slots 7 formed are then filled at least partially with an organic filler. For example, at first, a block 4 having the slots 7 is placed in a closed vessel, and an organic filler is introduced via an inlet port into the vessel while evacuating the vessel, thus filling the slots 7 with the filler. The filler filled is then allowed to cure. An organic filler formed of a thermosetting resin can be cured by heating.

After the curing, a voltage is applied to the conductive layers 2 and 3 to provide the segments 1 with piezoelectricity. Thereafter, the composite body 10 thus produced is worked into a parallelepiped or a columnar body in the external configuration shown in FIG. 1A.

Then, the acoustic matching layer 9 and the backing material 11 are integrally attached to the composite body 10 which has electrodes on its opposite surfaces. Alternatively, a plurality of composite bodies 10 provided with the acoustic matching layer 9 are integrally bonded to the backing material 11. Thus the elements 20, 30 or 40 shown in FIGS. 6A to 6C are obtained.

Finally, a wiring is applied to each element. The wiring can be performed only by connecting each of the GND and the signal lead lines 12 and 13 to the elements 20, 30 and 40. Such a simple wiring work can accomplish the wiring to all the segments. Thus, the ultrasonic transducers as shown in FIGS. 6A to 6C can be manufactured.

As explained above, the present invention can provide an ultrasonic transducer which can facilitate the wiring to each piezoelectric body and reduce a disconnection of electrodes during the operation of the transducer. Further, the present invention can provide a method for manufacturing an ultrasonic transducer having the said features. As a result, the reliability and durability of the ultrasonic transducer can be improved.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An ultrasonic transducer comprising;

a piezoelectric block which is formed into a plurality of piezoelectric segments by way of one or more slots, said one or more slots being formed by reactive ion etching with a reactive gas comprising a fluoride, spaced apart, on one main surface of the block, said segments being connected with each other at one and the other of the opposed main surfaces of said block;

an organic filler filled at least partially in said slots;

first and second electrodes formed respectively on said one and the other of the continuous main surfaces of said segments;

an acoustic matching layer formed on said one main surface of said block; and a backing material formed on said other main surface of said block.

2. An ultrasonic transducer consisting of a plurality of ultrasonic transducer elements, each element comprising;

a piezoelectric block which is formed into a plurality of piezoelectric segments by way of one or more slots, said slots being formed by reactive ion etching with a reactive gas comprising a fluoride, spaced apart, on one main surface of the block, said segments being connected with each other at one and the other of the opposed main surfaces of said block;

an organic filler filled at least partially in said slots;

first and second electrodes formed respectively on said one and the other of the continuous main surfaces of said segments;

an acoustic matching layer formed on said one main surface of said block; and a backing material formed on said other main surface of said block.

3. The ultrasonic transducer according to claim 1, wherein said plurality of segments are formed of at least one segment capable of oscillating in a thickness mode and at least one segment capable of oscillating in a longitudinal mode.

4. The ultrasonic transducer according to claim 1, wherein said piezoelectric block is formed of a piezoelectric single crystal.

5. The ultrasonic transducer according to claim 1, wherein said piezoelectric block is formed of a relaxor type ferroelectric substance.

6. The ultrasonic transducer according to claim 5, wherein said relaxor type ferroelectric substance is represented by the following formula:

$$Pb(B'B'')O_3$$

wherein B' is a bivalent or trivalent cation such as manganese (Mg) and zinc (Zn); and B" is a pentavalent or hexavalent cation such as niobium (Nb) and tungsten (W).

* * * * *